(12) United States Patent
Dokumaci et al.

(10) Patent No.: US 6,812,105 B1
(45) Date of Patent: Nov. 2, 2004

(54) ULTRA-THIN CHANNEL DEVICE WITH RAISED SOURCE AND DRAIN AND SOLID SOURCE EXTENSION DOPING

(75) Inventors: Omer H. Dokumaci, Wappingers Falls, NY (US); Bruce B. Doris, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,382

(22) Filed: Jul. 16, 2003

(51) Int. Cl.⁷ .............................................. H01L 21/336
(52) U.S. Cl. ...................... 438/300; 438/303; 438/305
(58) Field of Search ................................. 438/300, 197, 438/182, 226, 585, 303, 230, 231, 305, 783

(56) References Cited

U.S. PATENT DOCUMENTS

| | | |
|---|---|---|
| 6,287,924 B1 * | 9/2001 | Chao et al. ................ 438/300 |
| 6,329,704 B1 | 12/2001 | Akatsu et al. |
| 6,387,782 B2 | 5/2002 | Akatsu et al. |
| 6,509,221 B1 | 1/2003 | Doris et al. |
| 6,512,266 B1 * | 1/2003 | Deshpande et al. ......... 438/585 |
| 6,531,365 B2 | 3/2003 | Dokumaci et al. |
| 6,562,713 B1 | 5/2003 | Belyansky et al. |
| 6,583,016 B1 * | 6/2003 | Wei et al. ................... 438/303 |
| 6,586,289 B1 | 7/2003 | Dokumaci et al. |
| 2002/0155665 A1 | 10/2002 | Doris et al. |
| 2002/0197839 A1 | 12/2002 | Dokumaci et al. |

* cited by examiner

*Primary Examiner*—John F. Niebling
(74) *Attorney, Agent, or Firm*—Scully, Scott, Murphy & Presser; Joseph P. Abate, Esq.

(57) ABSTRACT

The inventive method for forming thin channel MOSFETS comprises: providing a structure including at least a substrate having a layer of semiconducting material atop an insulating layer and a gate region formed atop the layer of semiconducting material; forming a conformal oxide film atop the structure; implanting the conformal oxide film; forming a set of spacers atop the conformal oxide film, said set of sidewall spacers are adjacent to the gate region; removing portions of the oxide film, not protected by the set of spacers to expose a region of the semiconducting material; forming raised source/drain regions on the exposed region of the semiconducting material; implanting the raised source/drain regions with a second dopant impurity to form a second dopant impurity region; and annealing a final structure to provide a thin channel MOSFET.

15 Claims, 4 Drawing Sheets

ULTRA-THIN CHANNEL DEVICE WITH RAISED SOURCE AND DRAIN AND SOLID SOURCE EXTENSION DOPING

BACKGROUND OF INVENTION

The present invention relates to semiconductor devices and methods of manufacture, and more particularly to a method for manufacturing an improved metal oxide semiconductor (MOS) transistor having a thin channel.

Field effect transistors (FETs) are the basic building block of today's integrated circuits. Such transistors can be formed in conventional substrates (such as silicon) or in the SOI layer of a silicon-on-insulator (SOI) substrate.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device, while maintaining the device's electrical properties. Additionally, all dimensions of the device must be scaled simultaneously in order to optimize electrical performance of a device.

Thin channel silicon-on-insulator (SOI) devices having a thickness of about 50 nm or less are a promising option to further continue SOI complementary metal oxide semiconductor (CMOS) device scaling. Thin silicon channel devices provide a sharper-sub-threshold slope (measure of the abruptness of the switching of the device), high mobility (because the device is operated at a lower effective field) and better short channel effect control.

A disadvantage of thin silicon channel devices is that as the silicon-on-insulator (SOI) film is thinned the series resistance increases. One solution to the increasing series resistance inherent in thin channel devices is the use of an elevated source/drain region that may be formed by selective epitaxial Si growth.

In prior art thin channel devices, the extension implants are implanted prior to the formation of the raised source/drain regions; creating at least the following problems. First, by implanting the thin Si layer with a high dose/high energy implant, the Si crystal layer may be amorphized. Additionally, during activation of the source/drain regions, the anneal processing step causes recrystallization of the amorphous layer, which may result in the formation of polysilicon and the formation of defects to the extension region resulting in a higher resistivity. In addition, it is also difficult to clean the surfaces since p-type regions are formed due to electrochemical reactions where the p-type material has a greater affinity for oxide material. Epitaxial growth requires a clean surface having a substantial crystalline structure. Another problem with growing selective epitaxial Si on doped surfaces is that there is a significant difference in the thickness grown as a function of time for p-type Si compared to n-type Si. The thickness depends not only on the dopant type but also on the amount of dopant. The thickness of epitaxial silicon is difficult to control in a high volume manufacturing environment.

Prior art process schemes directed toward overcoming the thermal budget and growing epitaxial silicon on doped surfaces include a disposable spacer approach, which is complex and cost inefficient. More specifically, in some prior art thin channel devices a wide disposable spacer is utilized to grow the raised source/drain regions. High-energy implants are then conducted to form deep source/drain regions. Following the implants, the wide disposable spacer is removed and the extension regions are formed. A wide spacer is typically used to form the raised source/drain implants. Thus, the Si region under the spacer is of appreciable dimension and is at least as thin as the channel region. Therefore, the above described prior art process does not overcome the problem of the high resistance region outside the raised source/drain area.

In view of the state of the art mentioned above, it would be highly desirable to provide a method for forming thin channel silicon-on-insulator devices that overcome the above described disadvantages in conventional processing

SUMMARY OF INVENTION

The present invention provides an integration scheme in which the extension dopants are mainly contained in an oxide film during the raised source/drain growth process. Therefore, the extension implants do not experience excessive diffusion as a result of the thermal budget of the raised source/drain growth process. Another advantage of the present invention is that the selective epitaxial Si is grown on an intrinsic Si surface, therefore overcoming the growth rate problems associated with growing Si on doped surfaces.

In broad terms, the inventive method for forming thin channel silicon-on-insulator devices comprises:

providing a structure including at least a substrate having a layer of semiconducting material atop an insulating layer and a gate region formed atop the layer of semiconducting material;

forming a conformal oxide film atop the structure;

implanting the conformal oxide film with a first dopant impurity to form a first dopant impurity region;

forming a set of spacers atop the conformal oxide film, said set of spacers are adjacent to said gate region;

removing portions of the conformal oxide film not protected by said set of spacers to expose a region of the semiconducting material;

forming raised source/drain regions on the exposed region of the semiconducting material;

implanting the raised source/drain regions with a second dopant impurity to form a second dopant impurity region; and activating the first dopant impurity region and the second dopant impurity region, whereby source/drain and source/drain extension regions are formed in the semiconducting material.

Another aspect of the present invention is a method for forming multiple thin channel devices on a single substrate, utilizing conventional photoresist masking, comprising the steps of:

providing a structure including at least a substrate having a layer of semiconducting material atop an insulating layer and a gate region formed atop the layer of semiconducting material;

forming a conformal oxide film atop the structure;

implanting the conformal oxide film with a first dopant impurity to form a first dopant impurity region, while blocking selected regions with a first blocking material;

removing the first blocking material and applying a second blocking material over the region implanted with the first dopant impurity;

implanting the conformal oxide film with a second dopant impurity and removing the second blocking material;

forming a set of spacers atop the conformal oxide film, said set of spacers are adjacent to said gate region;

removing portions of the conformal oxide film not protected by said set of spacers to expose a region of the semiconducting material;

forming raised source/drain regions on the exposed region of the semiconducting material;

implanting the raised source/drain regions with appropriate dopant impurities to form source/drain regions; and activating the dopant impurities, whereby source/drain and source/drain extension regions are formed in the semiconducting material.

More specifically, the inventive method includes depositing a conformal oxide film over an entire wafer, including the gate region of the device. The conformal oxide film is then implanted with the appropriate dopant impurity. A dielectric film is then deposited atop the conformal oxide layer and etched to form a spacer structure. Following spacer formation, the doped conformal oxide film is removed from the regions outside the spacer to expose the underlying wafer surface by a wet etch process, preferably including hydrofluoric acid. A portion of the doped conformal oxide film underlies the spacer and remains on the sidewalls of the gate region. The structure is then annealed to diffuse the dopant from the remaining portion of the conformal oxide into the underlying semiconducting layer to form extension regions.

In an alternate embodiment, p-doped and n-doped oxide films may be deposited over the p-type and n-type regions respectively, using a block mask and etch process.

In broad terms, the inventive method of forming thin channel MOSFETS comprises the steps of:

providing a structure including at least a substrate having a layer of semiconducting material atop an insulating layer and a gate region formed atop the layer of semiconducting material;

forming a doped conformal oxide film atop the structure;

forming a set of spacers atop the doped conformal oxide film, the set of spacers are adjacent to the gate region;

removing portions of the doped conformal oxide film, not protected by the set of spacers to expose a region of the semiconducting material;

forming raised source/drain regions on the exposed region of the semiconducting material;

implanting the raised source/drain regions with a dopant impurity to form a dopant impurity region; and activating the doped conformal oxide film and dopant impurity region, whereby source/drain and source/drain extension regions are formed in the semiconducting material.

More specifically, the inventive method includes depositing a doped oxide film, being a P-type doped oxide film or N-type oxide film, atop a substrate having at least one gate region. The P-type doped oxide film may comprise boron silicate glass (BSG). The N-type oxide film may comprise arsenic silicate glass (ASG) and phosphorus silicate glass (PSG). A dielectric film is then deposited atop the conformal oxide layer and etched to form a spacer structure. Following spacer formation, the doped conformal oxide film is removed from the regions outside the spacer to expose the underlying wafer surface by a wet etch process, preferably including hydrofluoric acid. A portion of the doped conformal oxide film underlies the spacer and remains on the sidewalls of the gate region. A raised source/drain region is formed by growing selective epitaxial silicon followed by source/drain implantation. The structure is then annealed to diffuse the dopant from the remaining portion of the doped conformal oxide into the underlying semiconducting layer to form extension regions. The annealing process activates the source/drain regions at the same time.

Another aspect of the present invention includes a thin channel silicon-on-insulator device formed by the above-described method. In broad terms, the thin channel silicon-on-insulator device comprises:

a substrate having a semiconducting material atop an insulating layer;

a gate region atop a portion of the semiconducting material;

a doped oxide film conformal to at least a sidewall of the gate region and atop a portion of the semiconducting material;

a set of spacers located on a horizontal surface of the conformal oxide film that lies adjacent to the gate region; and a raised source/drain region on either side of the gate region, where the raised source/drain region are separated from the gate region by the set of spacers.

DETAILED DESCRIPTION

Figure 1:
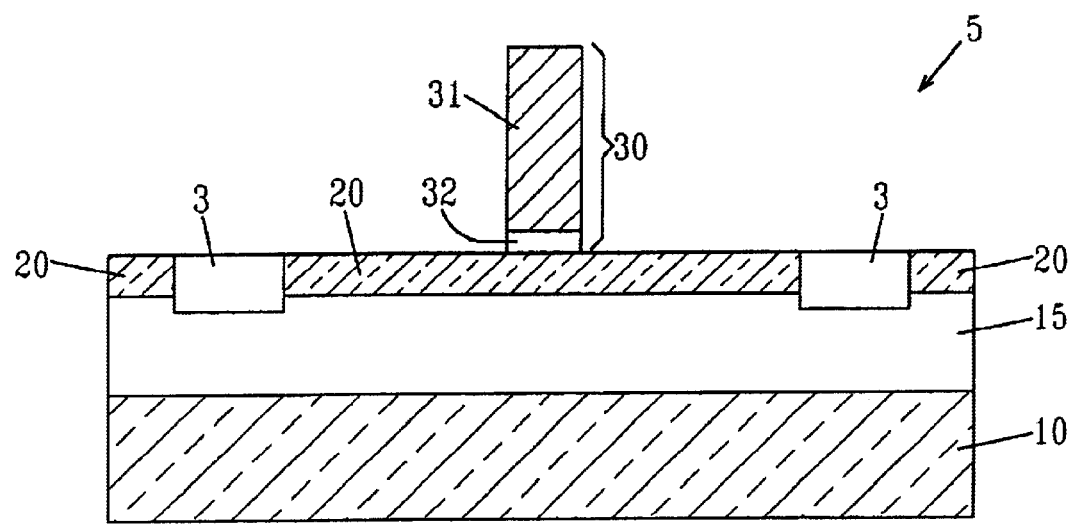
FIG. 1 is a pictorial representation (through a cross sectional view) of the initial structure of the present invention.

The present invention provides a method of forming an improved CMOS device having an ultra-thin channel device with raised source/drain regions and solid source extension doping. Thin Si channel devices have a channel with a thickness of less than about 200 Å, preferably less than about 150 Å. The present invention also provides a method of forming thin channel silicon-on-insulator devices where extension implant dopants are mainly contained in a conformal oxide film during the raised source/drain region growth process; therefore ensuring that extension implants are not subjected to excessive diffusion during the high temperature thermal processing of the raised source/drain regions. The present invention will now be described in more detail referring to the drawings accompanying the present application. It is noted that in the accompanying drawings, like and/or corresponding elements are referred to by like reference numerals.

Referring to FIG. 1, an initial structure 5 is provided including a substrate 10, an insulating layer 15, a thin layer of semiconducting material 20, isolation regions 3, and a gate region 30. The gate region 30 includes a gate electrode 31 atop a gate dielectric 32.

The semiconducting material 20 (which is referred to hereafter as SOI layer 20) may comprise any semiconducting material, including but not limited to: Si, strained Si, $Si_{1-y}C_y$, $Si_{1-x-y}Ge_xC_y$, $Si_{1-x}Ge_x$, Si alloys, Ge, Ge alloys, GaAs, InAs, InP as well as other III–V and II–VI semiconductors.

Substrate 10, insulating layer 15 and SOI layer 20 may be components of an SOI substrate, which is formed by a SIMOX (separation by ion implantation of oxygen) or by wafer bonding and separation.

The SOI layer 20 may be thinned to a desired thickness by planarization, grinding, wet etch, dry etch or any combination thereof. In a preferred embodiment, the Si layer is thinned by oxidation and wet etching to achieve the desired thickness. The SOI layer 20 preferably has a thickness of less than about 200 Å, more preferably less than about 150 Å.

Isolation regions 3 may be formed through the SOI layer 20 to contact or extend into the underlying insulating layer 15. Isolation regions 3 may be formed by etching the SOI layer 20 and depositing an insulting material into the etched region. The isolation region 3 is typically composed of an oxide.

The substrate 10 may be a semiconducting material. The term 'semiconductor' as used herein denotes any semiconducting material including, but not limited to: Si, strained Si, SiC, SiGe, SiGeC, Si alloys, Ge, Ge alloys, GaAs, InAs, InP as well as other III/V and II/VI compound semiconductors. The thickness of the substrate is inconsequential to the present invention.

The insulating layer 15 is located underlying the SOI layer 20 and atop the substrate 10. The insulating layer 15 may be formed by implanting a high-energy dopant into the substrate 10 and then annealing the structure to form a buried oxide layer below the surface of the initial structure 5. Alternatively, the insulating layer 15 may be deposited or grown prior to the formation of the semiconducting material 20. Alternatively, the initial structure may be formed using wafer-bonding techniques, in which a bonded wafer pair is formed utilizing glue, adhesive polymer, or direct bonding.

Still referring to FIG. 1, a gate region 30 is then formed on the semiconducting material 20. The gate region 30 is formed using conventional photolithography and etching. The gate region 30 comprises at least a gate electrode 31 atop a gate dielectric 32. First, the gate dielectric material 32 is formed followed by the gate electrode material 31. The gate conductor is then patterned by photolithography and etching.

Gate electrode 31 is preferably polysilicon but may also be comprised of conductors including, but not limited to: elemental metals, polysilicon, metal alloys, or metal silicides. The gate dielectric 32 may be a conventional dielectric material such as $SiO_2$ or $Al_3N_4$, or alternatively high-k dielectrics such as oxides of Ta, Zr, Al or combinations thereof. Typically, the gate dielectric 32 material has a thickness of from about 1 nm to about 10 nm, with a thickness of from about 1.5 to about 2.5 nm being more highly preferred.

Figure 2:
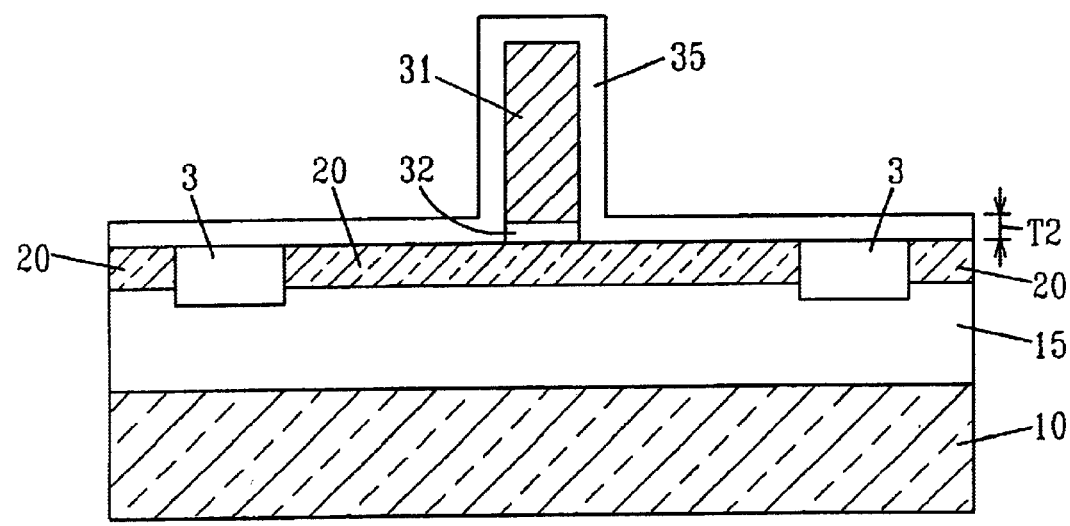
FIG. 2 is a pictorial representation (through a cross sectional view) of the structure of FIG. 1 further including a conformal oxide layer.

Referring to FIG. 2, an oxide layer 35 is then conformally deposited atop the substrate. The conformal oxide layer 35 preferably comprises $SiO_2$, but may be other oxide materials including, but not limited to: $ZrO_2$, $Ta_2O_5$ or $Al_2O_3$. The conformal oxide layer 35 may be deposited by chemical vapor deposition (CVD), plasma-assisted CVD, or chemical solution deposition. Alternatively, the conformal oxide layer 35 may be formed by a thermal growth process. Conformal oxide layer 35 has a thickness T2 ranging from about 2 nm to about 20 nm. The conformal oxide layer 35 may also be deposited as a doped oxide film. The doped conformal oxide film may be borosilicate glass (BSG), for p-type regions, and arsenic silicate glass (ASG) or phosphorus silicate glass (PSG) for n-type regions.

Figure 3:
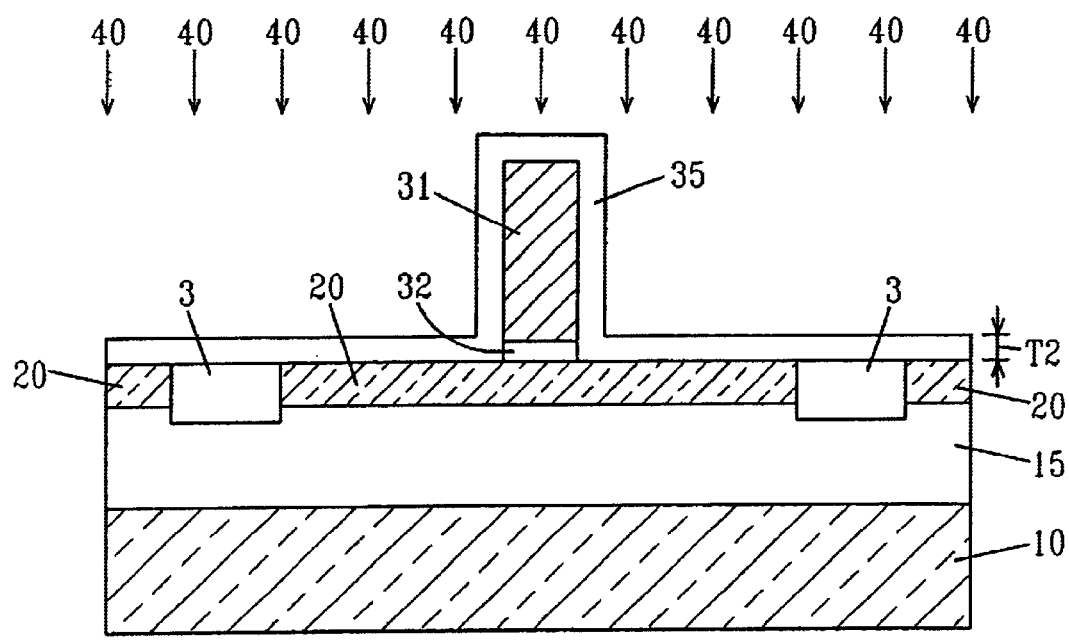
FIG. 3 is a pictorial representation (through a cross sectional view) depicting implanting the conformal oxide layer.

Following the formation of conformal oxide layer 35, a halo and extension implant is conducted, as indicated by the arrows 40 in FIG. 3. The implants may be comprised of a combination of normally incident and angled implants to form the desired grading in the extensions and halos. Optional halo regions 51 are located underneath and laterally adjacent to the extension regions 50 in the channel. The conformal oxide layer 35 may be doped by conventional doping methods well known by those of ordinary skill in the art including but not limited to: ion implant or plasma emersion. The dopant species is selected dependent on the device type. Since extension regions 50 are subsequently formed by diffusion of the implant species from the conformal oxide layer 35 into the thin SOI layer 20; P-type extension regions are typically produced within the SOI layer 20 by doping the conformal oxide layer 35 with group III-A elements and N-type extension regions are typically produced within the SOI layer by doping the conformal oxide layer 35 with group V elements. In the case of the p-type implants, a typical impurity species is boron or $BF_2$. Boron with an energy of about 0.2 keV to 3 keV or $BF_2$ with an energy of about 1 keV to about 15 keV and a dose of about $5 \times 10^{13}$ atoms/cm$^2$ to about $3 \times 10^{16}$ atoms/cm$^2$ can be used to implant the P-type region. A typical implant for the N-type regions is arsenic. The N-type regions can be implanted with arsenic using an energy of about 0.5 keV to 5 keV with a dose of about $3 \times 10^{13}$ atoms/cm$^2$ to about $3 \times 10^{16}$ atoms/cm$^2$. When the conformal oxide layer 35 is a doped oxide film, implanting may not be conducted.

Figure 4:
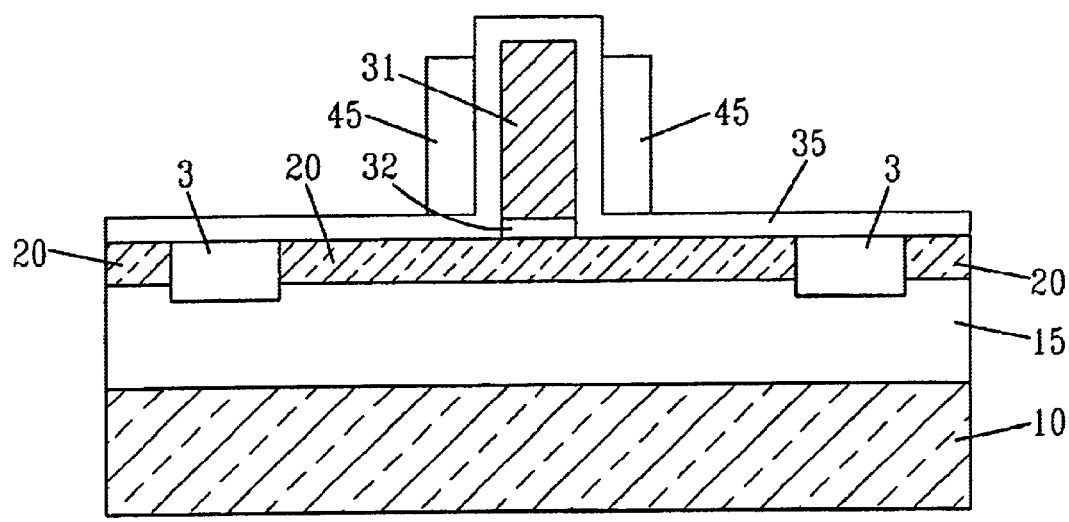
FIG. 4 is a pictorial representation (through a cross sectional view) of the structure of FIG. 3, further including the formation of a set of spacers.

A next processing step of the present invention includes the formation of insulating spacers 45 adjacent the sidewalls of the gate region 30, and atop a portion of the conformal oxide layer 35, as depicted in FIG. 4. Note that the spacers 45 are not in direct contact with gate region 30; a portion of conformal oxide layer 35 separates the spacer 45 from the gate region 30. Spacers 45 may be formed using conventional deposition and etching. Spacers 45 may comprise a dielectric material such as a nitride, oxynitride, or a combination thereof; most preferably being SiN. Spacers 45 may have a width ranging from about 2 nm to about 30 nm.

Figure 5:
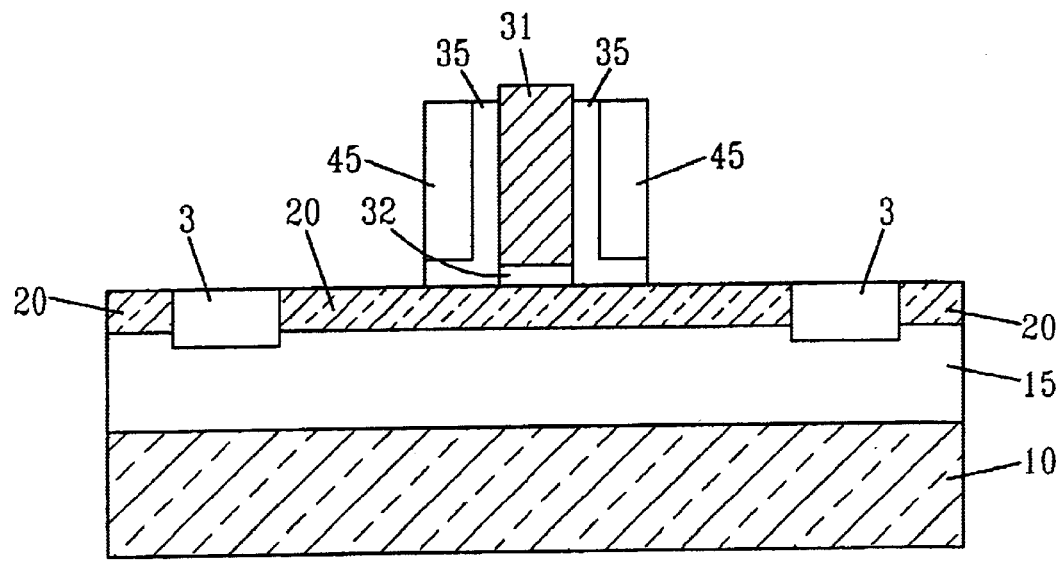
FIG. 5 is a pictorial representation (through a cross sectional view) of the structure shown in FIG. 4 after etching exposed portions of the conformal oxide layer.

Referring to FIG. 5, following the formation of spacers 45 a selective wet etch process is employed to remove exposed portions of the conformal oxide layer 35, while a remaining portion is protected by the overlying spacers 45.

Alternatively, the conformal oxide layer 35 not protected by spacers 45 may be removed by chemical oxide removal (COR) or another dry chemistry, or a combination of wet and dry chemistries. Chemical oxide removal is used to selectively etch oxide layers, e.g., the exposed portions of the conformal oxide layer, from the structure. The COR processing step comprises exposing the structure to a gaseous mixture of HF and ammonia at a pressure of about 30 mTorr or below, preferably at a pressure between about 1 mTorr and about 10 mTorr, and a temperature of about 25° C. or a temperature slightly above room temperature. The ratio of gaseous HF to gaseous ammonia is from about 1:10 to about 10:1, with a ratio of about 2:1 being more highly preferred. A solid reaction product is formed as a result of the structure's exposure to HF and ammonia gas. The solid reaction product includes etched oxide, reactants or combinations thereof. The solid reaction product is removed in a second step which includes heating the structure to a temperature about 100° C., thus causing the reaction product to evaporate and rinsing the structure in water, or removing the solid reaction product with an aqueous solution.

Figure 6:
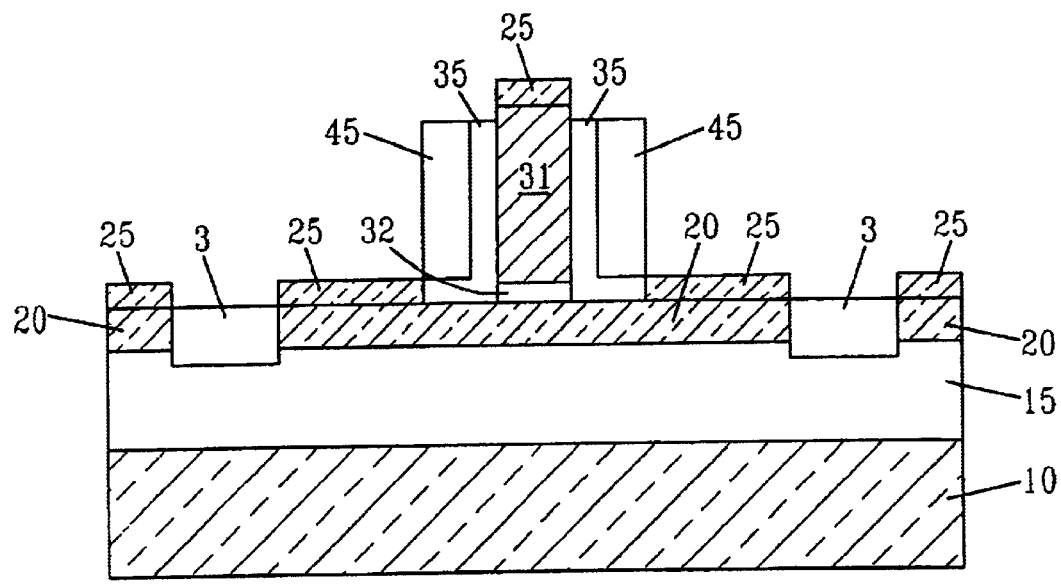
FIG. 6 is a pictorial representation (through a cross sectional view) of the structure shown in FIG. 5, further including the formation of raised source/drain regions.

Referring to FIG. 6, raised source/drain regions 25 are then formed using a selective epitaxial growth process. Epitaxial refers to the single crystalline structure of the film. Epitaxial Si growth may occur when silicon atoms are deposited on a bare silicon wafer in a CVD reactor. The fact that the process is selective means that the Si grows only on exposed Si regions of the wafer and does not grow on SiN or $SiO_2$. When the chemical reactants are controlled and the system parameters set correctly, the depositing atoms arrive at the wafer surface with sufficient energy to move around on the surface and orient themselves to the crystal arrangement of the wafer atoms. Thus, an epitaxial film that deposits on a <111> wafer will take on a <111> orientation. If the wafer surface has an amorphous surface layer, possibly the result of implanting, the depositing atoms have no surface to align to, resulting in the formation of polysilicon instead of single crystal silicon.

A number of different sources may be used for the deposition of selective epitaxial silicon. Silicon tetrachloride ($SiCl_4$) is a preferred source of silicon for epitaxial deposition. Silicon tetrachloride reacts with a Si surface in the following manner:

$$SiCl_4 + 2H_2 \leftrightarrow Si + 4HCl$$

The temperature for epitaxial silicon deposition typically ranges from about 600° C. to about 900° C. Although higher temperature typically results in faster deposition, the faster deposition may result in crystal defects and film cracking.

Another epitaxial Si source is silane ($SiH_4$). The silane epitaxial growth reaction is as follows:

$$SiH_4 + HEAT \rightarrow Si + 2H_2$$

Dichlorosilane ($SiH_2Cl_2$) may also be used as the epitaxial Si source. Dichlorosilane is also a low temperature source. The dichlorosilane epitaxial growth reaction is as follows:

$$SiH_2CL_2 \leftrightarrow Si + 2HCl$$

In order to produce a more selective process, such that the Si grows only on the Si and not on the oxide or nitride structures, a mixture of HCl and Dichloralsilane may be utilized, since HCl enhances selectivity.

Figure 7:
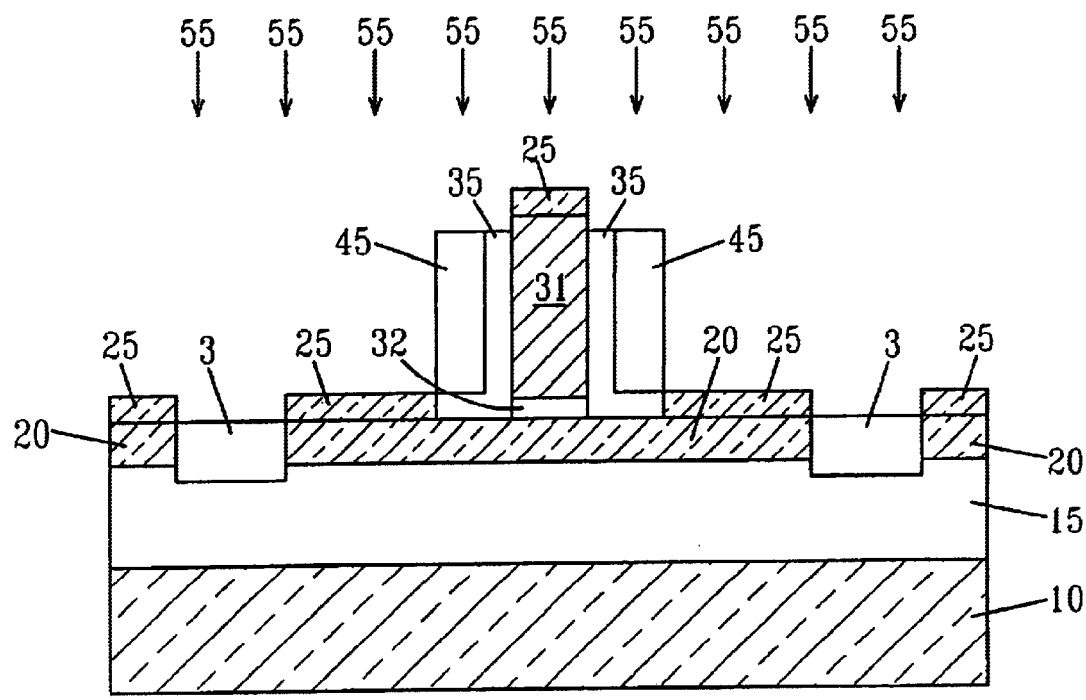
FIG. 7 is a pictorial representation (through a cross sectional view) of implanting the raised source/drain regions.

Heavily doped source/drain regions are then implanted, as indicated by the arrows 55 in FIG. 7, which subsequently facilitate the formation of diffusion regions. A typical implant species for the n-source drain region is phosphorus. The N-type source/drain may be implanted with phosphorus using an energy of about 3 keV to 15 keV with a dose of about $1 \times 10^{15}$ atoms/$cm^2$ to about $7 \times 10^{15}$ atoms/$cm^2$. The P-type source/drain can be implanted using boron with an energy of about 1 keV to 8 keV with a dose of about $1 \times 10^{15}$ atoms/$cm^2$ to about $5 \times 10^{15}$ atoms/$cm^2$.

Figure 8:
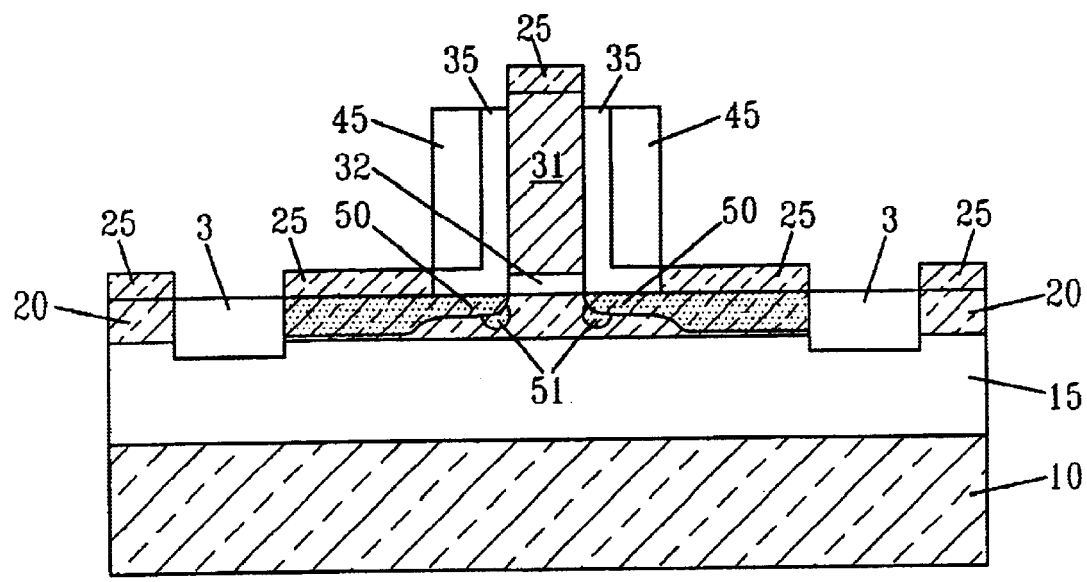
FIG. 8 is a pictorial representation (through a cross sectional view) of the structure shown in FIG. 7, further including the formation of source/drain and source/drain extension regions.

Referring to FIG. 8, extension regions 50 are then formed by an annealing process, such as rapid thermal annealing. The rapid thermal annealing temperature is carried out using a temperature of 750° C. to about 1200° C. for a time period of about 1 second to about 20 seconds. During the annealing process, thermal energy causes the implanted species within the remaining conformal oxide layer 35 to diffuse into the underlying SOI layer 20 forming extension regions 50. Annealing also activates the first dopant impurity region and second dopant impurity region of the device.

Although the present invention has been depicted using a single device for the purposes of clarity, multiple devices may be processed on a single substrate using conventional patterning techniques well known within the skill of the art. Regions of the substrate may be selectively processed by employing layers of photoresist and then patterning the layers of photoresist through photolithography.

More specifically, a layer of photoresist is deposited atop the entire structure. The photoresist layer may be comprised of dielectrics including carbon, oxygen, and various inorganic metals. The photoresist layer is then selectively patterned and developed to form a block mask, protecting at least one first region of the substrate and exposing at least one second region of the substrate. The exposed regions of the device are then processed while the regions underlying the block mask are protected. Following processing of the first region, the block mask is removed by conventional stripping techniques. Another block mask may be formed and utilized as described above for processing another region of the substrate. Therefore, substrates having multiple device regions are within the scope of the present invention.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a thin channel silicon-on-insulator device comprising:
    providing a structure including at least a substrate having a layer of semiconducting material atop an insulating layer and a gate region formed atop said layer of semiconducting material;
    forming a conformal oxide film atop said structure;
    implanting said conformal oxide film with a first dopant impurity to form a first dopant impurity region;
    forming a set of spacers atop said conformal oxide film, said set of spacers are adjacent to said gate region;
    removing portions of said conformal oxide film, not protected by said set of spacers to provide an exposed region of semiconducting material;
    forming raised source/drain regions on said exposed region of said semiconducting material;
    implanting said raised source/drain regions with a second dopant impurity to form a second dopant impurity region; and
    activating said first dopant impurity region and said second dopant impurity region, whereby source/drain and source/drain extension regions are formed in said layer of semiconducting material.

2. The method of claim 1 wherein said layer of semiconducting material has a thickness of less than about 200 Å.

3. The method of claim 1 wherein said raised source/drain regions are formed by a selective epitaxial growth process.

4. The method of claim 1 wherein said epitaxial growth process comprises depositing silicon.

5. The method of claim 1 wherein said conformal oxide film is formed by chemical vapor deposition (CVD), plasma-assisted CVD, high-density plasma chemical vapor deposition (HDPCVD), atomic layer deposition or thermal growth.

6. The method of claim 1 wherein said conformal oxide film has a thickness ranging from about 2 nm to about 20 nm.

7. The method of claim 1 wherein said portions of said conformal oxide film are removed by wet etching, dry etching, or a combination thereof.

8. The method of claim 1 wherein said first dopant impurity is a group IIIA dopant or a group V dopant.

9. The method of claim 1 wherein said activating said first dopant impurity region comprises an annealing process which forms said source/drain regions underlying a remaining portion of said conformal oxide film.

10. The method of claim 1 wherein said second dopant impurity is a group IIIA dopant or a group V dopant.

11. The method of claim 1 wherein implanting said conformal oxide film comprises an implant dose ranging from about $3 \times 10^{13}$ atoms/cm$^2$ to about $3 \times 10^{16}$ atoms/cm$^2$.

12. The method of claim 1 wherein implanting said conformal oxide film comprises an implant energy of about 0.2 keV to about 15 keV.

13. The method of claim 1 further comprising forming a second set of spacers adjacent said set of sidewall spacers prior to implanting said raised source/drain regions.

14. The method of claim 1 wherein said implanting said conformal oxide film further comprises halo implants.

15. A method of fabricating a thin channel silicon-on-insulator device comprising:

providing a structure including at least a substrate having a layer of semiconducting material atop an insulating layer and a gate region formed atop said layer of semiconducting material;

forming a doped oxide film atop said structure;

forming a set of spacers atop said doped oxide film, said set of spacers are adjacent to said gate region;

removing portions of said doped oxide film, not protected by said set of spacers to provide an exposed region of semiconducting material;

forming raised source/drain regions on said exposed region of said semiconducting material;

implanting said raised source/drain regions with a dopant impurity to form a dopant impurity region; and activating said doped oxide film and said second dopant impurity region, whereby source/drain and source/drain extension regions are formed in said layer of semiconducting material.

* * * * *